(12) United States Patent
Janson

(10) Patent No.: US 11,439,567 B2
(45) Date of Patent: Sep. 13, 2022

(54) WEARABLE THERMOELECTRIC ARRAY AS A GRAPHICAL USER INTERFACE

(71) Applicant: The Aerospace Corporation, El Segundo, CA (US)

(72) Inventor: Siegfried W. Janson, Redondo Beach, CA (US)

(73) Assignee: THE AEROSPACE CORPORATION, El Segundo, CA (US)

( * ) Notice: Subject to any disclaimer, the term of this patent is extended or adjusted under 35 U.S.C. 154(b) by 838 days.

(21) Appl. No.: 16/354,243

(22) Filed: Mar. 15, 2019

(65) Prior Publication Data

US 2020/0289359 A1 Sep. 17, 2020

(51) Int. Cl.

| A61H 3/06 | (2006.01) |
|---|---|
| H01L 35/02 | (2006.01) |
| G06F 3/01 | (2006.01) |
| A61H 3/00 | (2006.01) |

(52) U.S. Cl.
CPC ............. *A61H 3/061* (2013.01); *G06F 3/011* (2013.01); *H01L 35/02* (2013.01); *A61H 2003/007* (2013.01)

(58) Field of Classification Search
None
See application file for complete search history.

(56) References Cited

U.S. PATENT DOCUMENTS

| 8,411,058 | B2 | 4/2013 | Wong et al. | |
|---|---|---|---|---|
| 8,920,174 | B2 | 12/2014 | Tachi et al. | |
| 9,703,381 | B2 | 7/2017 | Gallo et al. | |
| 9,947,185 | B2 | 4/2018 | Cocuzza et al. | |
| 2005/0284152 | A1* | 12/2005 | Christiansen | G06F 3/0202 62/3.3 |
| 2010/0151426 | A1 | 6/2010 | Tachi et al. | |
| 2012/0018418 | A1* | 1/2012 | Shantha | A43B 7/02 219/482 |
| 2012/0050172 | A1 | 3/2012 | Wong et al. | |
| 2013/0087180 | A1* | 4/2013 | Stark | H01L 35/30 136/205 |
| 2013/0135214 | A1 | 5/2013 | Li et al. | |
| 2015/0083705 | A1* | 3/2015 | Cronn | H05B 3/347 219/549 |
| 2016/0238040 | A1 | 8/2016 | Gallo et al. | |

(Continued)

FOREIGN PATENT DOCUMENTS

WO 2009007952 A2 1/2009

OTHER PUBLICATIONS

Kajimoto et al., "Forehead Electro-Tactile Display for Vision Substitution", In Proc. EuroHaptics, Aug. 1, 2018.

(Continued)

*Primary Examiner* — Thomas S McCormack
(74) *Attorney, Agent, or Firm* — LeonardPatel PC

(57) ABSTRACT

A thermal display module configured to create a thermal pattern discerned by a visually impaired user to determine his or her surroundings. The thermal display module includes a plurality of thermoelectric modules, each of which are configured to cool or heat a pixel plate in close proximity to a user's skin. The cooling or heating of each of the thermoelectric modules create the thermal pattern discernable by the user.

18 Claims, 5 Drawing Sheets

(56) References Cited

U.S. PATENT DOCUMENTS

2016/0300462 A1* 10/2016 Cocuzza ............... G05D 23/22

OTHER PUBLICATIONS

Kajimoto et al., "HamsaTouch: Tactile Vision Substitution with Smartphone and Electro-Tactile Display", CHI 2014, One of a CHInd Toronto, ON, Canada.

Kappers et al., "Haptics: Generating and Perceiving Tangible Sensations", International Conference, EuroHaptics 2010, Amsterdam, Jul. 2010, Proceedings, Part II.

Kratz, et al., "Thermo Touch: Design of a High Dynamic (Temperature) Range Thermal Haptic Display", Aug. 1, 2018.

* cited by examiner

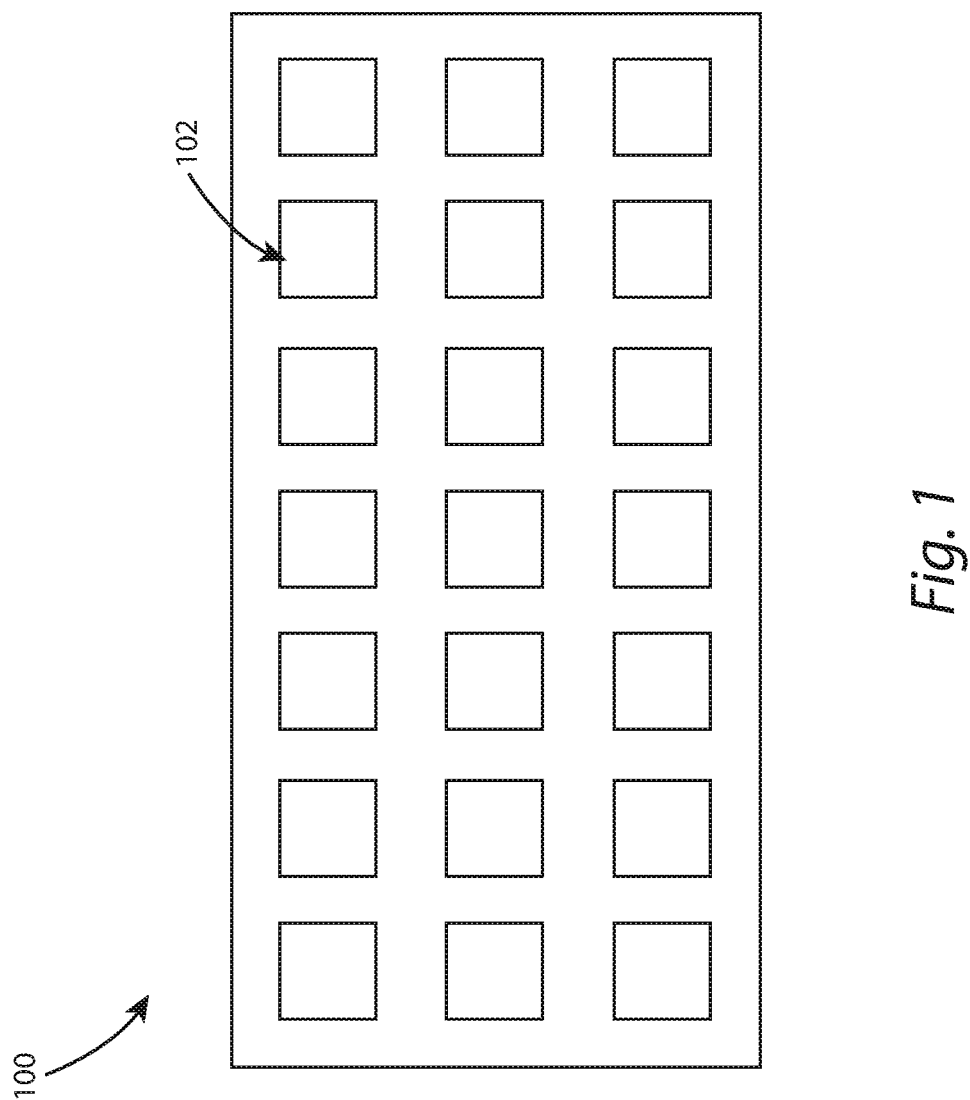

WEARABLE THERMOELECTRIC ARRAY AS A GRAPHICAL USER INTERFACE

FIELD

The present invention relates to a wearable device, and more particularly, to a wearable thermoelectric array configured to create a thermal pattern for a user.

BACKGROUND

Currently, people that are blind or visually impaired use assisted tools when walking from a first point to a second point. For example, a white cane is used by many people who are blind or visually impaired. Primarily, the white cane aids its user to scan his or her surroundings for obstacles or orientation marks.

Alternate human input devices, or tactile actuator arrays, are also used by the visually impaired or blind. These devices use electrodes, electromagnetic actuators, or bi-stable thermal actuators that stimulate skin, the surface of the tongue, the retina, etc. The University of Tokyo and EyePlusPlus Inc. have demonstrated a 16 by 32 array of electrodes worn on the forehead. Their experiments showed that a 3-mm spacing between electrodes was acceptable.

The electrode array requires a ~1-mm thick gel layer between the electrodes and the skin in order to eliminate pain senor stimulation. The sensing threshold is close to the pain threshold, and there's temporal and spatial variability in the skin due to sweating and changes in nerve density. For this reason, electrode stimulation may fail to work well for arrays. In addition, these electrode array operates by sending 300 V pulses into the skin. Not only is the electrode array difficult to apply and remove, but there is also a potential shock hazard.

Thus, an alternative wearable thermoelectric array may be more beneficial.

SUMMARY

Certain embodiments of the present invention may provide solutions to the problems and needs in the art that have not yet been fully identified, appreciated, or solved by current human input devices or tactile actuator arrays. For example, some embodiments generally pertain to a wearable thermoelectric array configured to create a thermal pattern that is discernable by the user.

In one embodiment, an apparatus includes a thermal display module configured to create a thermal pattern discerned by a user. The thermal display module includes a plurality of thermoelectric modules, each of which are configured to cool or heat a pixel plate in close proximity to a user's skin. The cooling or heating of each of the thermoelectric modules create the thermal pattern discernable by the user.

In another embodiment, an apparatus includes a thermal conductive substrate configured to create a thermal pattern discerned by a user. The thermal conductive substrate includes an array of individually-control thermal modules. Each of the individually-control thermal modules within the array include a thermal pixel element. The thermal pixel element is heated or cooled depending on current flow to create a two-dimensional thermal pattern discernable by the user.

In yet another embodiment, a thermal conductive substrate is configured to create a thermal pattern. The thermal conductive substrate includes an array of individually-controlled thermal modules, each of which include a plurality of thermoelectric elements sandwiched between a pixel plate and an insulator heat sink plate. Each of the plurality of thermoelectric elements are configured to be heated or cooled depending on current flow to create a two-dimensional thermal pattern discernable by a user.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which:

FIG. 1 is a block diagram illustrating a thermal conductive substrate configured to create a thermal pattern, according to an embodiment of the present invention.

DETAILED DESCRIPTION OF THE EMBODIMENTS

Some embodiments generally pertain to a thermally conductive substrate configured to create a thermal pattern discerned by a user. The thermally conductive substrate includes a plurality of thermoelectric modules, each of which are configured to cool or heat a thermal pixel surface. Each thermal pixel may be assigned to a particular area associated with the person's surrounding. The cooling or heating of each thermal pixel surface creates a two-dimensional thermal pattern discernable by the user. This way, visually impaired person may be able to discern his or her surroundings.

FIG. 1 is a block diagram illustrating a thermal conductive substrate 100 configured to create a thermal pattern, according to an embodiment of the present invention. In an embodiment, thermal conductive substrate 100 is a flexible circuit and includes an array of individually-controlled thermal modules 102 that each contain a thermal pixel element, which is heated or cooled depending on the flow of the current. For purpose of explanation, the term "modules 102" will be used, depending on the embodiment, the term "thermal conductive substrate 100" and "flexible substrate 100" may be interchangeably used.

Figure 2A:
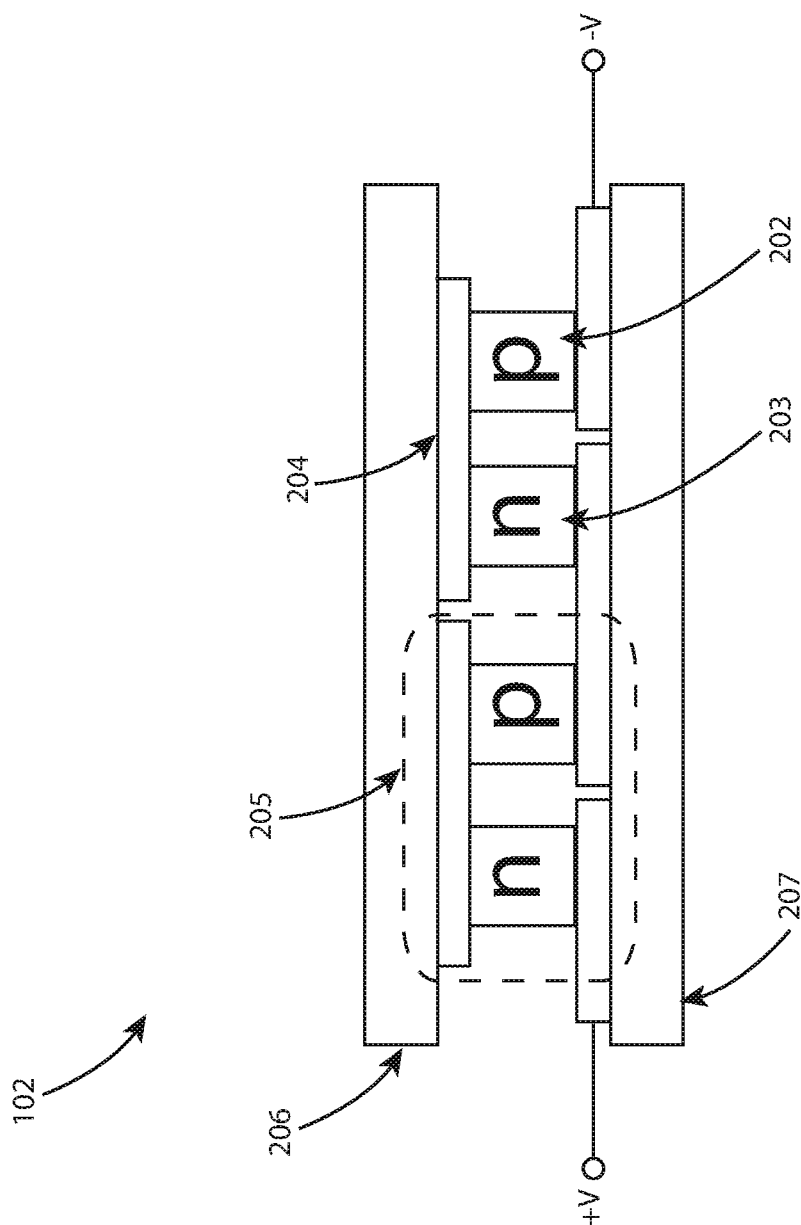
FIG. 2A is a cross-section diagram illustrating module in a thermal conductive substrate of FIG. 1, according to an embodiment of the present invention.

FIG. 2A is a cross-section diagram illustrating module 102 in a thermal conductive substrate of FIG. 1, according to an embodiment of the present invention. In this embodiment, module 102 includes a plurality of thermoelectric elements 205 sandwiched between an upper thermally-conductive, electrically-insulating pixel plate 206 and a lower thermally-conductive electrical insulator heat sink plate 207.

In some embodiments, thermoelectric elements 205 are composed of a pair of p- and n-type semiconductors, 202 and 203, respectively, electrically-connected in series using electrical conductors 204. Module 102 may have one to millions of thermoelectric elements 205, thermally connected in parallel.

FIG. 2A also shows module 102 being electrically-connected to a power supply, where the +V side has a more positive voltage than the −V side. With this polarity, heat is pumped from pixel plate 206 to heat sink plate 207 to cool upper pixel plate 206 and depositing this heat in heat sink plate 207. When the polarity is reversed, heat will be pumped from heat sink plate 207 to pixel plate 206 to heat pixel plate 206 using heat drawn from heat sink plate 207.

Returning to FIG. 1, modules 102 may generate a spatial temperature pattern. See, for example, FIG. 2A, which shows a cross section of (heating/cooling) module 102 from FIG. 1. In one example, each module 102 is independently capable of heating or cooling pixel plate 206 with respect to heat sink plate 207. When heat sink plates 207 are thermally-connected to each other via a common thermal conductive substrate 100, pixel plates 206 are set to different temperatures. During operation, pixel plates 206 of modules 102 are in parallel contact with a thin, flexible membrane 208. See, for example, FIG. 2B, which is a cross-section diagram illustrating thermal display 250, according to an embodiment of the present invention. In some embodiments, thermal conductive module 100 may be affixed to a thermal display 250.

Figure 2B:
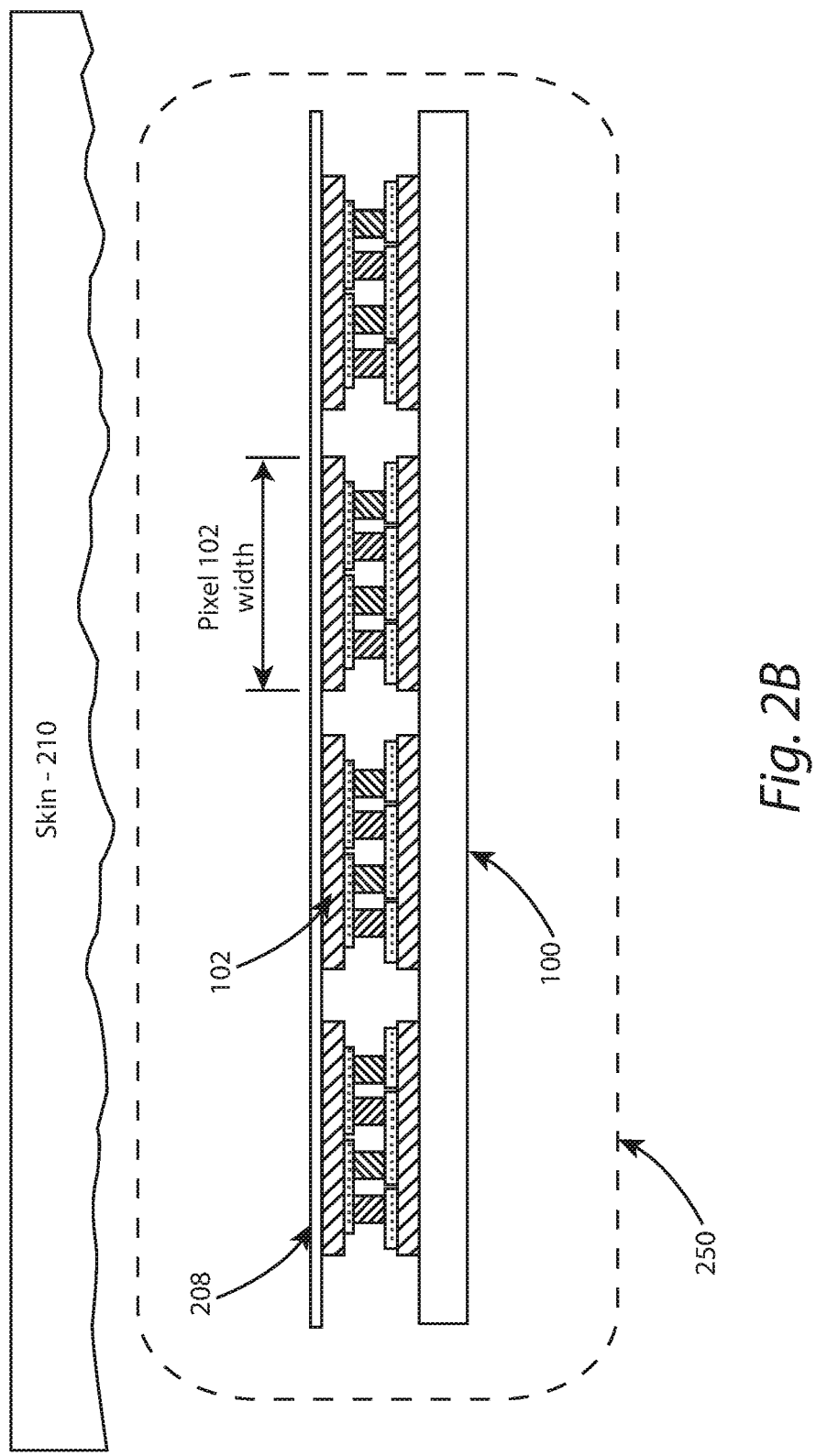
FIG. 2B is a cross-section diagram illustrating a thermal display in contact with a user's skin, according to an embodiment of the present invention.

In FIG. 2B, flexible membrane 208 physically isolates modules 102 from sweat, oils, dirt, etc., that may be present on, or generated by, user's skin or local environment 210. Flexible membrane 208 is held against user's skin 210 by pressing thermal display 250 onto skin 210. In certain embodiments, the thickness of flexible membrane 208 is much less than the width or depth of module 102. The thickness of flexible membrane 208 allows for a thermal pattern created by pixel plates 206 to be transferred to user's skin 210 with little lateral thermal diffusion. This thermal pattern may then be discerned by user's skin 210.

Flexible membrane 208, in some embodiments, is in contact with a visually impaired person's skin 210. For example, flexible membrane 208 is in contact with the person's forehead, the person's cheek(s), the person's upper and/or middle back, etc. The placement of flexible membrane 208 is placed depending on the application.

Each module 102 may be a thermal pixel with side dimensions of a millimeter to a few centimeters. Pixel plate (or thermal pixel plate) 206 of the thermal pixels are warmed to a predefined temperature, e.g., 10 degrees Fahrenheit higher than normal skin temperature or cooled to a predefined temperature, e.g., 10 degrees Fahrenheit lower than normal skin temperature.

As each pixel plate 206 in a module 102 changes in temperature, flexible membrane 208 conducts this temperature locally to skin 210 to provide a low-resolution thermal "display" to the visually impaired individual. All thermal heat sink plates 207 are connected to a flexible substrate 100 to provide electrical connections, local module power control, and active (e.g., fans, fluid cooling, etc.) or passive (e.g., thermal mass or phase change material) temperature control to dispose of the waste heat generated by modules 102.

Although not shown, a computing system (e.g., mobile phone, tablet, etc.) may determine and control the temperature of each pixel plate 106 in each module 102 mounted on flexible substrate 100. Flexible substrate 100 may include a power source (not shown) configured to power flexible substrate 100 and modules 102.

In some embodiments, flexible substrate 100 may be connected to a thermal display module (e.g., a head display unit) 250. In those embodiments, as each module 102 cools or heats, corresponding graphical data is generated to illustrate nearby objects, range to nearby objects, temperature of nearby objects, magnetic orientation, absolute orientation, etc.

Figure 3:
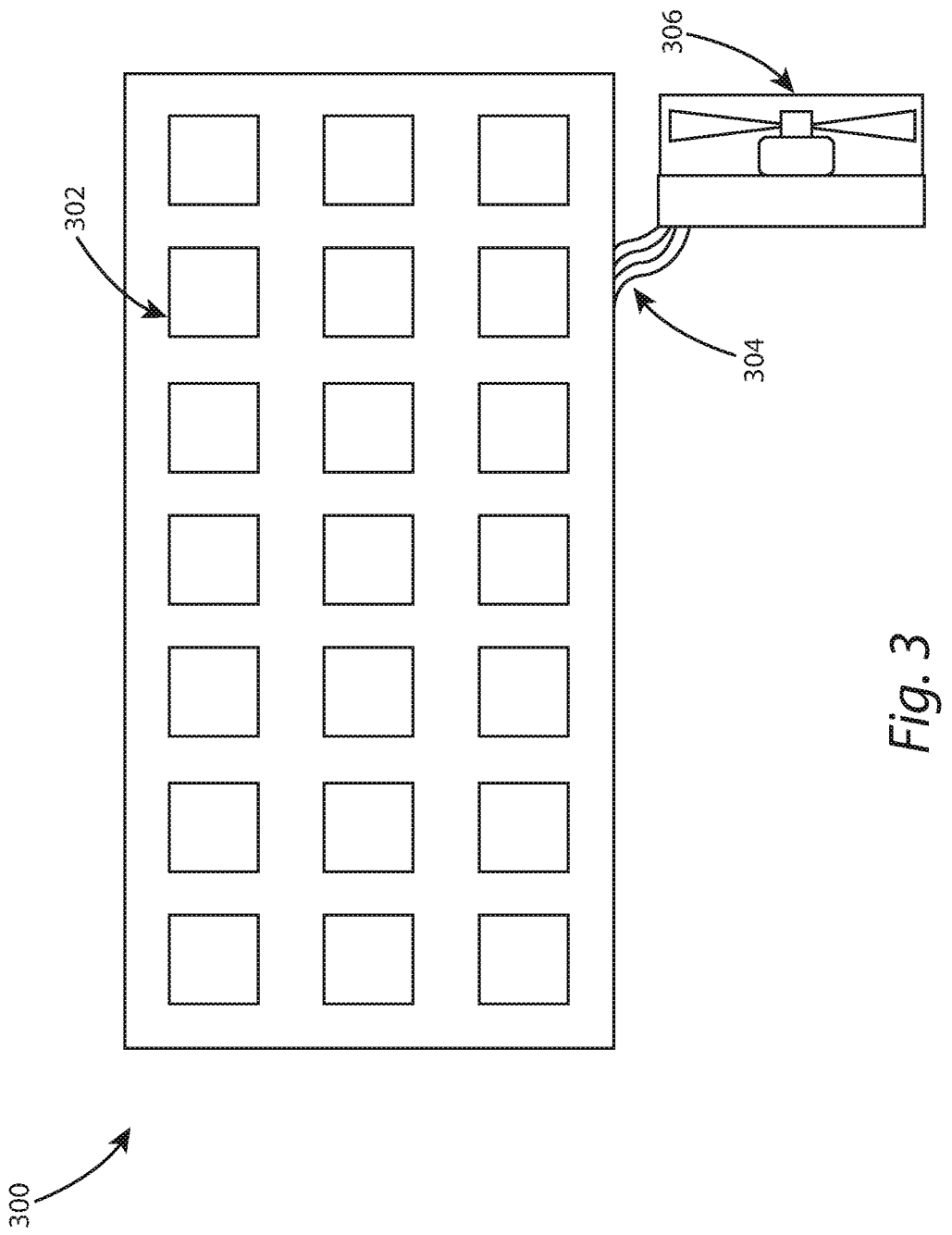
FIG. 3 is a block diagram illustrating a high-density thermal conductive module, according to an embodiment of the present invention.

FIG. 3 is a block diagram illustrating a high-density thermal display module 300, according to an embodiment of the present invention. In this embodiment, thermal display module 300 includes an array of modules 302, each of which have similar functions to those modules 102 of FIG. 1. High-density thermal conductive module 300 may be flexible, in certain embodiments. In this embodiment, high-density thermal display module 300 includes a thermal conductive substrate, which has a similar function to the thermal conductive substrate 100 of FIG. 2B. Connected to high-density thermal display module 300 is a cooling fan 306. One or more flexible straps 304 connect high-density thermal display module 300 (and in particular modules 302) with cool fan 306. In some embodiments, cooling fan 306 convectively cools display module 300, when necessary, by moving ambient air across a part of flexible straps 304. This may be similar to cooling fans used in computers and electronics. In other embodiments, cooling fan 306 may be a rotary fan, scroll, fan, centrifugal fan, etc.

Figure 4:
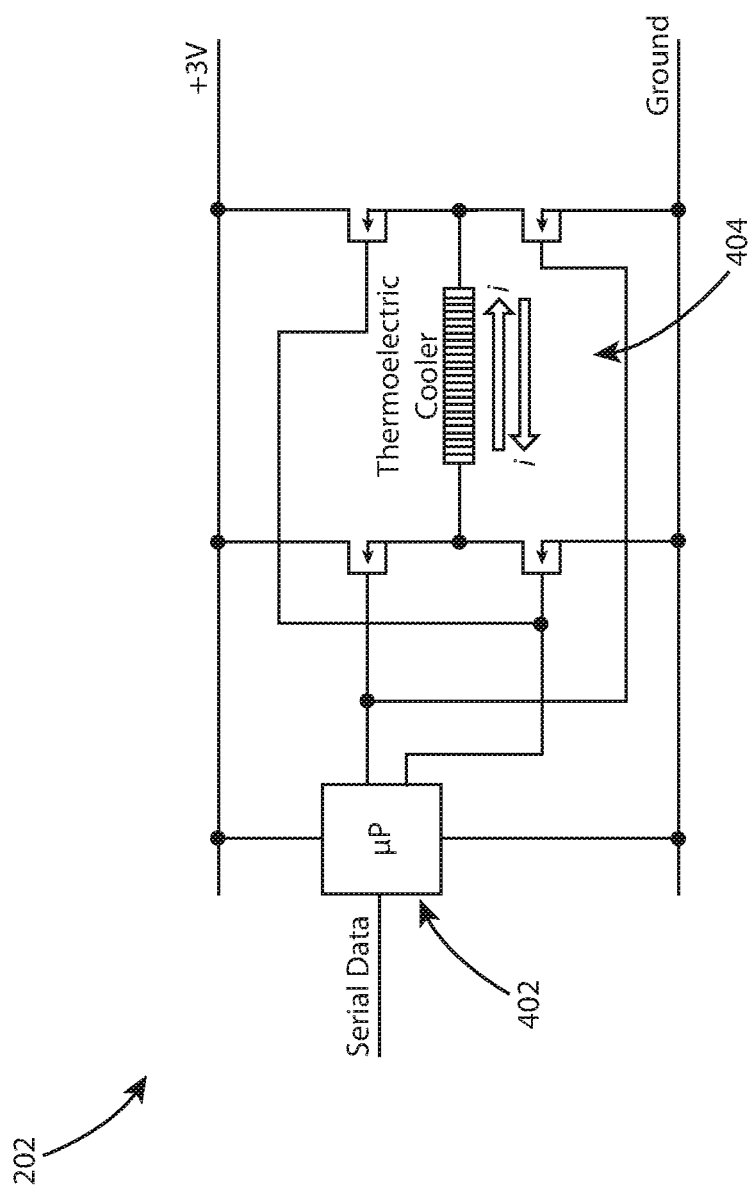
FIG. 4 is a circuit diagram illustrating a module of the thermal conductive module, according to an embodiment of the present invention.

FIG. 4 is a circuit diagram illustrating a module 202 of thermal conductive module 102 or 302 of FIG. 1 or 3, according to an embodiment of the present invention. In this embodiment, module 202 includes a microprocessor 402 and a temperature control unit 404.

In some embodiments, microprocessor 402 receives serial data from another microprocessor embedded within the thermally conductive substrate. Microprocessor 402 may process this serial data and cause temperature control unit 404 to increase or decrease the temperature. Because the other thermally conductive substrate's microprocessor communicates with multiple modules, each microprocessor has its own unique address. This approach enables a single serial line from the other processor to control all modules 102.

In another embodiment, a row-column drive approach may be used where one active row and one active column selects a single module 102 for actuation. The entire array of modules 102 may have to be scanned at some rate, e.g., 1 Hz, and a latching mechanism may have to be used to continue to drive a single module 102 while the on-going row column scanning activates other modules with updated information.

The microprocessor approach shown in FIG. 4 also significantly reduces the number of power and signal lines required between thermal display module 300 and the computing system to the minimum number of 3—power, ground, and signal. In FIG. 4, two microprocessor outputs control the direction of current flow through associated thermoelectric cooler module 102 using a 4-transistor circuit to generate heating or cooling of the pixel plate in module 102. To heat or cool with proportional control, microprocessor 402 may output an analog voltage signal to provide analog control of the current, and direction, for temperature control unit 404.

Some embodiments generally pertain to an array of individually-controlled thermoelectric elements, pixel plates, in close contact with a person's skin through thin membrane to create a thermal pattern. The individual thermoelectric elements are thermal pixels with side dimensions of a millimeter to a few centimeters. In certain embodiments, the pixels may be warm (e.g., 10 degrees Fahrenheit higher than skin temperature) or cool (10 degrees Fahrenheit lower than skin temperature). The individually-controlled thermoelectric elements provide a low-resolution thermal "display" as either the primary graphical input, or as a secondary graphical input, for a visually impaired individual.

In certain embodiments, the thermal display module 300 is in contact with a person's body. For example, the display module is in contact with the person's forehead, either side or both sides of the person's cheeks, the person's upper and/or middle back, etc., depending on the application.

In some additional embodiments, a wearable computer system may drive a thermal display module, and a wearable battery may power both the computer and display. Graphical data can be range to nearby objects, temperature of nearby objects, magnetic orientation, absolute orientation, etc.

In an embodiment, an apparatus includes a thermal display module configured to create a thermal pattern discerned by a user. The thermal display module includes a plurality of thermoelectric modules, each of which are configured to cool or heat a pixel plate in close proximity to a user's skin. The cooling or heating of each of the thermoelectric modules creates the thermal pattern discernable by the user.

In one embodiment, the thermally conductive heat sink substrate is a flexible substrate. In another embodiment, the flexible substrate is a flexible copper substrate.

In some embodiments, the thermally conductive substrate is affixed to a body of the person, allowing the person to discern surroundings near the person according to the cooling or the heating of each of the thermoelectric modules.

In certain embodiments, the plurality of thermoelectric modules are situated in an array format.

In yet another embodiment, a cooling fan configured to receive release heat from each of the thermoelectric modules and cool the thermally conductive substrate. One or more flexible thermal straps connect the thermally conductive substrate with the cooling fan and are configured to pass the heat from each of the thermoelectric modules to the cooling fan.

In some embodiments, a thin, flexible membrane on top of the thermal pixel plates to seal the module against sweat, oil, dust, etc., from the user or user's environment.

In certain embodiments, temperature control of individual pixel plates is controlled using a fixed magnitude of current, with directional control and pulse width modulation. In another embodiment, temperature control of individual pixel plates is controlled using a variable magnitude of current (analog control), with direction control.

In an embodiment, an apparatus may include a thermal conductive substrate configured to create a thermal pattern discerned by a user. The thermal conductive substrate includes an array of individually-control thermal modules. Each of the modules within the array includes a thermal pixel element that is heated or cooled depending on current flow to create a two-dimensional thermal pattern discernable by the user.

In some embodiments, the thermal conductive substrate is a flexible circuit.

Also, in some embodiments, each of the modules includes a plurality of thermoelectric elements sandwiched between an upper thermally-conductive, electrically insulating pixel plate and a lower thermally-conductive electrical insulator heat sink plate.

In certain embodiments, each of the plurality of thermoelectric elements are composed of a pair of p- and n-type semiconductors electrically connected in series using a plurality of electrical conductors.

Also, in certain embodiments, each of the modules are electrically connected to a power supply, where +V side has greater voltage than −V side, such that heat is pumped from the insulating pixel plate to the insulator heat sink pink to cool the insulating pixel plate and depositing the heat in the insulator heat sink plate.

In some further embodiments, when polarity is reversed, heat is pumped from the insulator heat sink plate to the insulating pixel plate to heat the insulating pixel plate using the heat drawn from insulator heat sink plate.

Also, in some further embodiments, a flexible membrane physically isolates each of the modules against sweat, oil, dust, etc., from the user or user's environment.

In certain embodiments, a cooling fan is configured to receive released heat from each of the thermoelectric modules and cool the thermally conductive substrate.

Also, in certain embodiments, one or more flexible thermal straps connect the thermally conductive substrate with the cooling fan and are configured to pass the heat from each of the modules to the cooling fan.

In yet another embodiment, a thermal conductive substrate configured to create a thermal pattern includes an array of individually-controlled thermal modules Each of the modules include a plurality of thermoelectric elements sandwiched between a pixel plate and an insulator heat sink plate. Further, each of the plurality of thermoelectric elements are configured to be heated or cooled depending on current flow to create a two-dimensional thermal pattern discernable by a user.

It will be readily understood that the components of various embodiments of the present invention, as generally described and illustrated in the figures herein, may be arranged and designed in a wide variety of different configurations. Thus, the detailed description of the embodiments, as represented in the attached figures, is not intended to limit the scope of the invention as claimed, but is merely representative of selected embodiments of the invention.

The features, structures, or characteristics of the invention described throughout this specification may be combined in any suitable manner in one or more embodiments. For example, reference throughout this specification to "certain embodiments," "some embodiments," or similar language means that a particular feature, structure, or characteristic described in connection with the embodiment is included in at least one embodiment of the present invention. Thus, appearances of the phrases "in certain embodiments," "in some embodiment," "in other embodiments," or similar language throughout this specification do not necessarily all refer to the same group of embodiments and the described features, structures, or characteristics may be combined in any suitable manner in one or more embodiments.

It should be noted that reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

The invention claimed is:

1. An apparatus, comprising:
 a thermal display module configured to create a thermal pattern discerned by a user, wherein
 the thermal display module comprises a plurality of thermoelectric modules, each of which are configured to cool or heat a pixel plate in close proximity to a user's skin, and
 wherein the cooling or heating of each of the thermoelectric modules create the thermal pattern discernable by the user; and
 a cooling fan configured to receive release heat from each of the thermoelectric modules and cool the thermally conductive substrate.

2. The apparatus of claim 1, wherein the thermally conductive heat sink substrate is a flexible substrate.

3. The apparatus of claim 2, wherein the flexible substrate is a flexible copper substrate.

4. The apparatus of claim 1, wherein the thermally conductive substrate is affixed to a body of the person, allowing the person to discern surroundings near the person according to the cooling or the heating of each of the thermoelectric modules.

5. The apparatus of claim 1, wherein the plurality of thermoelectric modules are situated in an array format.

6. The apparatus of claim 1, further comprising:
 one or more flexible thermal straps connecting the thermally conductive substrate with the cooling fan, configured to pass the heat from each of the thermoelectric modules to the cooling fan.

7. The apparatus of claim 1, further comprising a thin, flexible membrane on top of the thermal pixel plates to seal the module against sweat, oil, dust, etc., from the user or user's environment.

8. The apparatus of claim 1, wherein temperature control of individual pixel plates is controlled using a fixed magnitude of current, with directional control and pulse width modulation.

9. The apparatus of claim 1, wherein temperature control of individual pixel plates is controlled using a variable magnitude of current (analog control), with direction control.

10. An apparatus, comprising:
 a thermal conductive substrate configured to create a thermal pattern discerned by a user,
 wherein the thermal conductive substrate comprising an array of individually-control thermal modules ("modules"),
 each of the modules within the array comprises a thermal pixel element, and
 the thermal pixel element is heated or cooled depending on current flow to create a two-dimensional thermal pattern discernable by the user; and
 a cooling fan configured to receive released heat from each of the modules and cool the thermally conductive substrate.

11. The apparatus of claim 10, wherein the thermal conductive substrate is a flexible circuit.

12. The apparatus of claim 10, wherein each of the modules comprises a plurality of thermoelectric elements sandwiched between an upper thermally-conductive, electrically insulating pixel plate and a lower thermally-conductive electrical insulator heat sink plate.

13. The apparatus of claim 12, wherein each of the plurality of thermoelectric elements are composed of a pair of p- and n-type semiconductors electrically connected in series using a plurality of electrical conductors.

14. The apparatus of claim 12, wherein each of the modules are electrically connected to a power supply, where +V side has greater voltage than −V side, such that heat is pumped from the insulating pixel plate to the insulator heat sink pink to cool the insulating pixel plate and depositing the heat in the insulator heat sink plate.

15. The apparatus of claim 14, wherein, when polarity is reversed, heat is pumped from the insulator heat sink plate to the insulating pixel plate to heat the insulating pixel plate using the heat drawn from insulator heat sink plate.

16. The apparatus of claim 12, further comprising:
 a flexible membrane physically isolating each of the modules against sweat, oil, dust, etc., from the user or user's environment.

17. The apparatus of claim 10, further comprising:
 one or more flexible thermal straps connecting the thermally conductive substrate with the cooling fan, configured to pass the heat from each of the modules to the cooling fan.

18. A thermal conductive substrate configured to create a thermal pattern, comprising:
 an array of individually-controlled thermal modules ("modules"), each of which comprise a plurality of thermoelectric elements sandwiched between a pixel plate and an insulator heat sink plate, wherein
 each of the plurality of thermoelectric elements are configured to be heated or cooled depending on current flow to create a two-dimensional thermal pattern discernable by a user; and
 a cooling fan configured to receive released heat from each of the modules and cool the thermally conductive substrate.

* * * * *